(12) United States Patent
Lowman et al.

(10) Patent No.: US 12,527,146 B2
(45) Date of Patent: Jan. 13, 2026

(54) SPUTTER PROTECTIVE LAYER FOR ORGANIC ELECTRONIC DEVICES

(71) Applicant: SMARTKEM LIMITED, Manchester (GB)

(72) Inventors: Ian Lowman, Eccles (GB); John Morgan, Blackley (GB); Soad Mohialdin-Khaffaf, Altrincham (GB); Colin Watson, Llanfairfechan (GB); Beverley Brown, Warrington (GB)

(73) Assignee: SMARTKEM LIMITED, Manchester (GB)

(*) Notice: Subject to any disclaimer, the term of this patent is extended or adjusted under 35 U.S.C. 154(b) by 688 days.

(21) Appl. No.: 17/253,827

(22) PCT Filed: Jun. 27, 2019

(86) PCT No.: PCT/GB2019/051807
§ 371 (c)(1),
(2) Date: Dec. 18, 2020

(87) PCT Pub. No.: WO2020/002914
PCT Pub. Date: Jan. 2, 2020

(65) Prior Publication Data
US 2021/0119157 A1    Apr. 22, 2021

(30) Foreign Application Priority Data
Jun. 29, 2018 (GB) ..................... 1810710

(51) Int. Cl.
*H10K 10/46* (2023.01)
*C08F 230/08* (2006.01)
(Continued)

(52) U.S. Cl.
CPC ......... *H10K 10/471* (2023.02); *C08F 230/08* (2013.01); *C09D 4/00* (2013.01);
(Continued)

(58) Field of Classification Search
CPC .... H10K 10/471; H10K 10/464; H10K 85/40; H10K 85/151; C08F 230/08; C09D 4/00; C09D 143/04
(Continued)

(56) References Cited

U.S. PATENT DOCUMENTS

| | | | |
|---|---|---|---|
| 5,902,715 A * | 5/1999 | Tsukamoto | G02B 6/2551 430/290 |
| 6,013,323 A | 1/2000 | Klayder et al. | |

(Continued)

FOREIGN PATENT DOCUMENTS

| | | | |
|---|---|---|---|
| CN | 1184265 | * | 6/1998 |
| CN | 104162502 | * | 11/2014 |

(Continued)

OTHER PUBLICATIONS

Chisca, Dielectric and conduction propeties of polyimide films, IEEE conference paper, Oct. 2011, 253-256 (Year: 2011).*

(Continued)

*Primary Examiner* — Sheng-Bai Zhu
(74) *Attorney, Agent, or Firm* — Birch, Stewart, Kolasch & Birch, LLP

(57) ABSTRACT

The present invention provides an organic gate insulator (OGI) layer having a low dielectric constant (k), said organic gate insulator layer being over-coated with a cross-linked organic layer (OSPL) having a relatively high permittivity (k). The present invention also provides an electronic device comprising such an organic thin film transistor. The invention also provides a solution for producing said OSPL, and a process for producing said OSPL.

11 Claims, 8 Drawing Sheets

(51) Int. Cl.
  *C09D 4/00* (2006.01)
  *C09D 143/04* (2006.01)
  *H10K 85/10* (2023.01)
  *H10K 85/40* (2023.01)
(52) U.S. Cl.
  CPC .......... *C09D 143/04* (2013.01); *H10K 85/40* (2023.02); *H10K 10/464* (2023.02); *H10K 85/141* (2023.02); *H10K 85/151* (2023.02)
(58) Field of Classification Search
  USPC ........................................... 257/40
  See application file for complete search history.

(56) References Cited

U.S. PATENT DOCUMENTS

| | | | |
|---|---|---|---|
| 2005/0104058 A1 | 5/2005 | Veres et al. | |
| 2006/0147177 A1* | 7/2006 | Jing | C09D 151/10 428/323 |
| 2015/0148474 A1 | 5/2015 | Taira et al. | |
| 2015/0205199 A1* | 7/2015 | Baldwin | G03F 7/202 430/281.1 |
| 2015/0344709 A1 | 12/2015 | Araki | |
| 2016/0370507 A1 | 12/2016 | Hisamitsu et al. | |
| 2017/0179414 A1* | 6/2017 | Choi | H10K 85/657 |
| 2019/0136109 A1* | 5/2019 | Agapov | C08K 3/36 |

FOREIGN PATENT DOCUMENTS

| | | | | |
|---|---|---|---|---|
| CN | 107275483 | * | 10/2017 | |
| CN | 109065811 | * | 12/2018 | |
| CN | 110760948 | * | 2/2020 | |
| EP | 1873174 | * | 1/2008 | |
| EP | 1873174 A1 | * | 1/2008 | ......... B29C 37/0053 |
| EP | 2264804 B1 | * | 11/2015 | |
| ES | 2598905 | * | 1/2017 | |
| JP | 58029744 | * | 2/1983 | |
| JP | 2005-513788 A | | 5/2005 | |
| JP | 2007-145965 A | | 6/2007 | |
| JP | 2008106083 | * | 5/2008 | |
| JP | 2010038945 | * | 2/2010 | |
| JP | 2010093092 | * | 4/2010 | |
| JP | 2015-224340 A | | 12/2015 | |
| JP | 2021167260 | * | 10/2021 | |
| KR | 10-2014-0025748 A | | 3/2014 | |
| KR | 101702595 | * | 2/2017 | |
| TW | 201545872 | * | 12/2015 | |
| WO | WO 03052841 | * | 6/2003 | |
| WO | WO-03052841 A1 | * | 6/2003 | ........... C09B 57/008 |
| WO | WO 2005036652 | * | 4/2005 | |
| WO | WO-2005036652 A1 | * | 4/2005 | ........... H01L 21/312 |
| WO | WO 2008/068705 A1 | | 6/2006 | |
| WO | WO 2008/131836 A1 | | 11/2008 | |
| WO | WO 2010/020329 A1 | | 2/2010 | |
| WO | WO 2010026798 | * | 3/2010 | |
| WO | WO 2012/003918 A1 | | 1/2012 | |
| WO | WO 2012/160382 A1 | | 11/2012 | |
| WO | WO 2012/160383 A1 | | 11/2012 | |
| WO | WO 2012/184282 A1 | | 12/2012 | |
| WO | WO 2013/000531 A1 | | 1/2013 | |
| WO | WO 2013/124682 A1 | | 8/2013 | |
| WO | WO 2013/124683 A1 | | 8/2013 | |
| WO | WO 2013/124684 A1 | | 8/2013 | |
| WO | WO 2013/124685 A1 | | 8/2013 | |
| WO | WO 2013/124686 A1 | | 8/2013 | |
| WO | WO 2013/124687 A1 | | 8/2013 | |
| WO | WO 2013/124688 A2 | | 8/2013 | |
| WO | WO 2013/159863 A1 | | 10/2013 | |
| WO | WO 2014/005667 A1 | | 1/2014 | |
| WO | WO 2014/017396 A1 | | 1/2014 | |
| WO | WO 2014/083328 A1 | | 6/2014 | |
| WO | WO 2015/028768 A1 | | 3/2015 | |
| WO | WO 2015/058827 A1 | | 4/2015 | |
| WO | WO 2015/133542 A1 | | 9/2015 | |
| WO | WO 2016/015804 A1 | | 2/2016 | |
| WO | WO 2017/141317 A1 | | 8/2017 | |
| WO | WO 2018/078080 A1 | | 5/2018 | |

OTHER PUBLICATIONS

Yao, Fluorinated poly(meth)acrylate: synthesis and properties, Polymer 55 6197-6211 (Year: 2014).*
Japanese Office Action for corresponding Japanese Application No. 2020-571828, dated Feb. 14, 2023, with English translation.
Bao et al., "Mechanistic Study of Plasma Damage of Low k Dielectric Surfaces," J. Vac. Sci. Technol. 8. vol. 26, No. 1, Jan./Feb. 2008 (Published Jan. 23, 2008), pp. 219-226.
Lubrizol Limited, "Pemulen ™M 1622 Polymer," Safety Data Sheet, Version 1.2, https://safety365.sevron.co.uk/substances/msds/pemulen-1622-polymer-msds-download-206385, Jun. 4, 2015, pp. 1-10, XP055619677.
Lubrizol, "Pemulen™ 1622 Polymer," https://www.lubrizol.com/Home-Care/Product-Finder/Products-Data/Pemulen-1622-polymer, Sep. 9, 2019, pp. 1-3, XP055619696.
Ono et al., "Optical Observation of Deep Bulk Damage in Amorphous Perfluorocarbon Films Produced by UV Photons Emitted from Low-Pressure Argon Plasma," Journal of Photopolymer Science & Technology, vol. 27, No. 3, 2014, pp. 393-398.
Veres et al., "Low-k Insulators as the Choice of Dielectrics in Organic Field-Effect Transistors," Adv. Funct. Mater. vol. 13, No. 3, Mar. 2003, pp. 199-204.
Korean Office Action for corresponding Korean Application No. 10-2021-7001193, dated Jan. 19, 2024, with English translation.

* cited by examiner

SPUTTER PROTECTIVE LAYER FOR ORGANIC ELECTRONIC DEVICES

FIELD OF THE INVENTION

The invention relates to electronic devices including organic thin film transistors (OTFTs) comprising a solution-coatable, cross-linkable Organic Sputter Protective Layer (OSPL) in direct contact with a low permittivity organic gate insulator (OGI), wherein the OSPL is incorporated to prevent sputter damage to the OGI during processing of transistors, and provides transistors retaining their pre-plasma electrical performance metrics.

BACKGROUND OF THE INVENTION

Thermal evaporation of metals is a commonly used laboratory technique for the deposition of contact electrodes in test arrays of electronic devices. Generally, the source materials are resistively heated to the point where they sublime and condense on to the substrate forming a thin film. There is minimal heat transfer or physical damage to the substrate and the resultant films are usually of high purity due to the lack of any gas inclusion (as in sputtering) and the high vacuum needed for this process. Where metal films of very high purity are required, for example in the fabrication of electrochemical, or bio sensors and where surface purity may impact performance, evaporation is preferred. These attributes encourage evaporation to be used as a research and development technique to deposit electrodes on polymeric organic substrates without damaging their physical and chemical structure. However, evaporation is difficult to scale up as uniformity over large areas is poor, throughput is low, and it is therefore not widely used in industrial manufacturing processes.

In the industrial fabrication of electronic devices including transistor arrays, manufacturers use plasma processes to deposit the metal electrodes. This is due to the high throughput of the sputter process coupled with the fact that sputter tools already exist on most electronics manufacturing lines. The effect of plasma-induced damage to low permittivity organic dielectrics is known and was reported by Bao et al., Mechanistic study of plasma induced damage to low k dielectric surfaces; Journal of Vac. Sci. & Tech., B: Microelectronics and Nanometer structures, Processing Measurement, and Phenomena, 26, 219, 2008, doi: 101116/1.2834562. It is particularly problematic when amorphous polymeric organic materials are being used as the layer directly exposed to plasma. This is due to bombardment from ions, electrons and UV photons generated during plasma sputtering which cause structural damage to the organic material. Furthermore, plasma-induced damage to amorphous perfluoropolymer layers was reported in the Journal of Photopolymer Sci & Technology; Vol 27, No. 3, 2014, pp 393-398[1] where it stated that C—F bonds are particularly prone to plasma damage. The deep UV photons generated have energies in the range of 11.6-11.8 eV which is sufficient to break C—C, C—O and C—F bonds in the Cytop™. These damaged bonds may cross-link or recombine forming defects/dipoles and traps at, or close to the OSC/OGI interface.

In organic transistors, low k dielectric materials such as amorphous perfluoropolymers are preferred organic gate insulator materials, particularly when using small molecule organic semiconductors (OSCs) in combination with polymeric binders. Veres et al., Adv. Func. Mat; 2003, 13, No. 3, pp 199-204, reported that the use of low permittivity OGI materials in OTFTs minimises interfacial trapping between the organic semiconductor and the organic gate insulator (OGI). This is due to minimising modulation of random dipole moments, resulting in organic thin film transistors having close to ideal electrical characteristics.

Particularly preferred OGI materials for top gate (TG) OTFTs include perfluoropolymers such as Cytop™, Hyflon™ and TEFLON AF.™ In this case, the perfluoropolymer is the layer within the organic thin film transistor that is directly exposed to plasma sputtering (layer 5, FIG. 3). When top gate OTFTs comprising materials such as Cytop™ as gate insulator are exposed to plasma sputtering processes, UV photons cause irreversible damage to the chemistry of the Cytop™ layer. In the OTFT, this damage is manifest as a number of undesirable electrical characteristics including high threshold voltage values (Vth), high turn on voltages (Vto), high subthreshold swing (SS), high off currents, low $I_{on/off}$ ratios and poor bias stress stability. The importance of these electrical parameters is well understood by the skilled person.

The deleterious impact of the high energy particles from plasma sputtering on the performance of organic field-effect transistors incorporating a perfluoropolymer OGI is shown in FIG. 10. FIG. 10 shows that when top gate TFTs were fabricated without an OSPL on top of the OGI (TFTS-SKBL756) compared to the control TFT (SKBL808) made with an evaporated gate, the Vth value increased from 8.0 volts to 16.4 volts, Vto increased from 11.8 volts to 23.5 volts and the subthreshold swing increased from 1.3 volts/decade to 2.4 volts/decade. FIG. 11 demonstrates that TFTs fabricated with an OSPL layer in-situ prior to exposure to the sputter process and deposition of the gate metal retain their pre-plasma electrical properties. The resulting higher operating voltages in turn results in devices having higher power consumption. Cytop™ is known to suffer damage in an argon plasma. With the said OSPL in-situ, there is minimal change in the post-plasma values for Vth, Vto, SS, Ion, Ioff and Ion/off ratio (≤20% change).

WO2008/131836 describes a process for preparing organic field effect transistors (OFETs) incorporating a layer to minimise damage to exposed parts of the surface of the dielectric layer. The protective layer is deposited onto the OGI prior to exposure to plasma or sputtering processes and is optionally removed from the device. The patent discloses that preferred protective layers are perfluoropolymers such as Cytop™ (refer to page 14, lines 23-25 and page lines 1-5). However, in direct contradiction to the teaching of WO2008/131836, we have found that Cytop™ is irreversibly damaged on exposure to even low levels of low energy Ar plasma. Beside the UV generated particles, other energetic particles may be formed during a typical sputter process, such as reflected Ar (17-25 eV and sputtered atoms (~10 eV). The energy of these particles is sufficient to break C—C(~3.7 eV), C—O (~3.5 eV) and C—F bonds (~5 eV) within the organic layers.

Cytop™ and perfluoropolymers as a class of materials afford no protection from sputter damage and therefore should not be used as the protective layer in OTFTs.

One of the problems that is solved by the invention is how to uniformly solution coat an OSPL ink onto a low surface energy OGI material such as CYTOP™ that has a surface free energy of only 14-18 mN/m without the need to use a surface pre-treatment process such as plasma or chemical etching of the OGI to increase its surface energy. In the case of OTFTs, plasma or chemical treatment would irreversibly damage the OGI and render the OTFT useless. WO2008/131836 does not provide any teaching on how to achieve uniform solution coating onto perfluoropolymers, whereas our invention solves this industrially relevant technical problem. Furthermore, in TG OTFTs as in the invention, if the same material was solution coated as the OSPL onto an amorphous perfluoropolymer OGI it would simply re-dissolve the OGI. The teaching in WO2008/131836 is not applicable to TG devices. A further major difference in this invention compared to WO2008/131836 is the requirement for an OSPL having a higher permittivity than the OGI for the benefits of higher capacitance in the TFT channel as previously described. WO2008/131836 prefers low permittivity OGI and low permittivity OSPL.

SUMMARY OF THE INVENTION

In a first aspect, the present invention provides an organic gate insulator (OGI) layer having a dielectric constant (k)<3.0 @ 1000 Hz, said organic gate insulator layer being over-coated with a cross-linked organic layer (OSPL).

Preferably, the cross-linked organic layer has a permittivity (k)>3.3 @ 1000 Hz, more preferably the cross-linked organic layer has a k>4.0 at 1000 Hz.

In a second aspect of the invention, there is provided an organic thin film transistor, comprising a substrate, one or more source/drain electrodes, at least one gate electrode, an organic semiconductor layer, and an organic gate insulator layer comprising a dielectric material having a dielectric constant (k)<3.0 @ 1000 Hz, said organic gate insulator layer being over-coated with a cross-linked organic layer. Preferably the cross-linked organic layer has a permittivity (k)>3.3 @ 1000 Hz, more preferably the cross-linked organic layer has a k>4.0 at 1000 Hz.

In a third aspect of the invention there is provided an electronic device comprising an organic thin film transistor according to the second aspect of the invention.

In a fourth aspect of the present invention, there is provided a solution comprising (a) at least one multi-functional acrylate, (b) optionally a non-acrylate organic solvent, (c) a fluoropolymer surfactant and an acrylate- and/or methacrylate-functionalised silicone surfactant, and (d) at least one type pf photo-initiator. Such a solution is commonly referred to as an ink in this technical field.

In a fifth aspect of the invention there is provided a process for solution deposition of a cross-linkable organic layer on to a low surface energy organic gate insulator, wherein the solution comprises at least one fluorosurfactant and at least one, acrylate- and/or methacrylate-functionalised silicone surfactant. In this process, the cross-linked organic layer (OSPL) is formed from the solution according to the fourth aspect of the invention. This process preferably affords a continuous, defect-free, organic layer followed by crosslinking of the organic cross-linkable layer. This aspect of the invention enables the effective over-coating of low surface energy OGIs, in particular, fluoropolymers. The approach developed avoids the need to use aggressive chemical or plasma etching of the fluoropolymer surface prior to ink deposition; neither of which are desirable when fabricating organic thin film transistors.

Fluorosurfactants used in the present invention are synthetic organofluorine compounds that have multiple fluorine atoms. They can be polyfluorinated or fluorocarbon-based (perfluorinated). As surfactants, they are more effective at lowering the surface tension of water than comparable hydrocarbon surfactants. Preferably, they have a fluorinated "tail" and a hydrophilic "head."

The cross-linkable organic layer has excellent curing characteristics in air or nitrogen and is preferably capable of forming on the surface of a substrate a substantially planar cured layer having excellent hardness, high plasma resistance, excellent thermal durability and high tensile strength.

In all aspects of the present invention, the cross-linked organic layer is referred to as the Organic Sputter Protection Layer (OSPL). This is preferably coated directly on to a low k (dielectric constant) organic gate insulator (OGI) layer to minimise damage to the OGI from a sputter/plasma process.

As used herein, OGI means an Organic Gate Insulator
As used herein, TG means Top Gate
As used herein BG means Bottom Gate
As used herein OTFT means Organic Thin Film Transistor
As used herein OSC means Organic Semiconductor Specifically, the OSPL preferably has a high crosslink density of ≤3H pencil hardness and preferably reaches >70% conversion by FTIR on exposure to 2.4 J/cm$^2$ at 365 nm wavelength (This provides high resistance to plasma-induced damage, high resistance to chemical damage, high thermal durability and high tensile strength).

The OSPL also reduces delamination of the low k OGI layer from the underlying interface that can occur.

It is also possible to overcoat one OSPL with a second OSPL. Essentially, the first OSPL can be used as a primer for the second OSLP, which may have the same or different properties to the first OSPL. In this way, the OGI may have multiple OSPL layers built up on its surface.

The cross-linkable OSPL may be cured chemically, thermally or photochemically. The cross-linked OSPL preferably has a pencil hardness, of between 2H to 6H, preferably between 3H to 6H measured using ASTM-D3363.

The present invention also enables the over-coating of any low surface energy polymer layer. According to all aspects of the present invention, the OGI layer has a surface free energy (SFE)≤25 mN/m, preferably less than 20 mN/m and more preferably less than 15 mN/m. The approach avoids the need to use an aggressive chemical or plasma etching pre-treatment of the low surface energy organic gate insulator prior to OSPL deposition, neither of which are desirable when fabricating thin film transistors due to resulting ion-doping of the OTFTs.

According to a preferred embodiment of the fourth aspect of the present invention the OSPL ink has a surface tension in the range of 18 to 35 mN/m, more preferably 21 to 28 mN/m. The relatively low surface tension of the OSPL ink enables wetting of the OGI. This is preferably achieved by using a combination of a fluorosurfactant and a silicone surfactant. Preferably, the fluorosurfactant is a perfluorosurfactant. Preferably, the silicone surfactant is a silicone surfactant having acrylate or methacrylate functionalities. Examples of such silicone surfactants are described in EP1828813. Alternatively, such silicone surfactants are preferably polydimethyl or polytrimethyl siloxane polymers, modified with one or more acrylate and/or methacrylate functionalities. Such siloxane polymers preferably also contain a hydrophilic moiety, such as a phosphate or sulphate moiety. For example, preferred polymers include Dowsil™ fa 4103 silicone acrylate, which is an acrylates/polytrimethylsiloxymethacrylate copolymer (and) laureth-1 phosphate copolymer. Further preferred silicone surfactants include Silmer ACR D208, Silmer ACR Di-50, Silmer ACR Di-1508, Silmer ACR Di-2510, Silmer ACR Di-4515-O and Silmer ACR Di-10, obtainable from Siltech.

It is postulated that this combination is effective because the fluorosurfactant migrates to the OGI interface, and the silicone surfactant is crosslinked into the bulk of the OSPL layer.

Fluorosurfactants used in the present invention include perfluoro oligomers and perfluoropolymers. Examples of fluorosurfactants suitable for use include linear chain fluorinated functional groups of $F(CF_2)_n$— where n=3 to 50 Such surfactants are sold under the trade name CAPSTONE, MEGAFACE or FC-4332, sold by 3M under the Novec trade name. In particular, MEGAFACE F-563 from DIC is preferred.

The invention aims to protect the OGI from plasma-induced damage by providing a highly cross-linked OSPL coated directly onto the OGI. This in turn, enables OTFT arrays that retain their pre-sputter/plasma electronic characteristics, such as low threshold voltage values (preferably $\Delta Vth$ post plasma <2V @ Vg volts (measured in the linear regime), low turn on voltages (preferably Vto post plasma <3V) low off currents (preferably <$10^{-10}$ A), low change in sub-threshold swing values (preferably $\Delta SS$ post plasma <0.5V) and high $I_{on/off}$ ratios (preferably $\geq 10^6$). Benefits include OTFTs having lower threshold voltage values, lower turn on voltages, improved sub-threshold swing, higher on currents, low off currents and high on/off ratios, all of which enable improved driving capability. Lower off currents reduces leakage currents (and concomitantly power consumption in the off state). Low Vth is required to reduce the gate voltage needed to maintain an OTFT in the off state. Low Vth combined with a low sub-threshold swing reduces power consumption and improves the switching speed of the device.

The OSPL of the invention preferably has a higher permittivity than the OGI. For example, the OGI material has a dielectric constant (k)<3.0 @ 1000 Hz, preferably <2.5 @ 1000 Hz. The OSPL preferably has a higher permittivity than the OGI layer, typically >1 unit higher than the OGI. The OSPL has a dielectric constant (k)>3.3 @ 1000 Hz, preferably >3.5 @ 1000 Hz, preferably >4.0 @ 1000 Hz. Such higher permittivity is provided by the polar, multi-functional acrylate components of the OSPL ink (discussed in detail below). This feature can advantageously be used to increase the overall capacitance of the OGI/OSPL layer in the active channel region of the transistor. A higher gate capacitance is desirable to reduce device operating voltages. However, this is best achieved by increasing the permittivity rather than reducing the thickness of the OGI, to prevent dielectric breakdown. The dual layer formed by the low permittivity OGI and higher permittivity OSPL has an effective permittivity higher than the OGI, increasing capacitance and maintaining dielectric integrity, whilst retaining the benefit of having a low permittivity insulator directly in contact with the OSC as explained above. The sputter protective layer remains in place in the OSC/OGI channel region of the OTFT throughout the lifetime of the device and is not removed.

The OSPL preferably has a permittivity lower than the OSC layer.

In a particularly preferred embodiment, the OTFTs of the present invention can contain more than one OSPL in the OTFT stack.

DETAILED DESCRIPTION OF THE INVENTION

Figure 1:
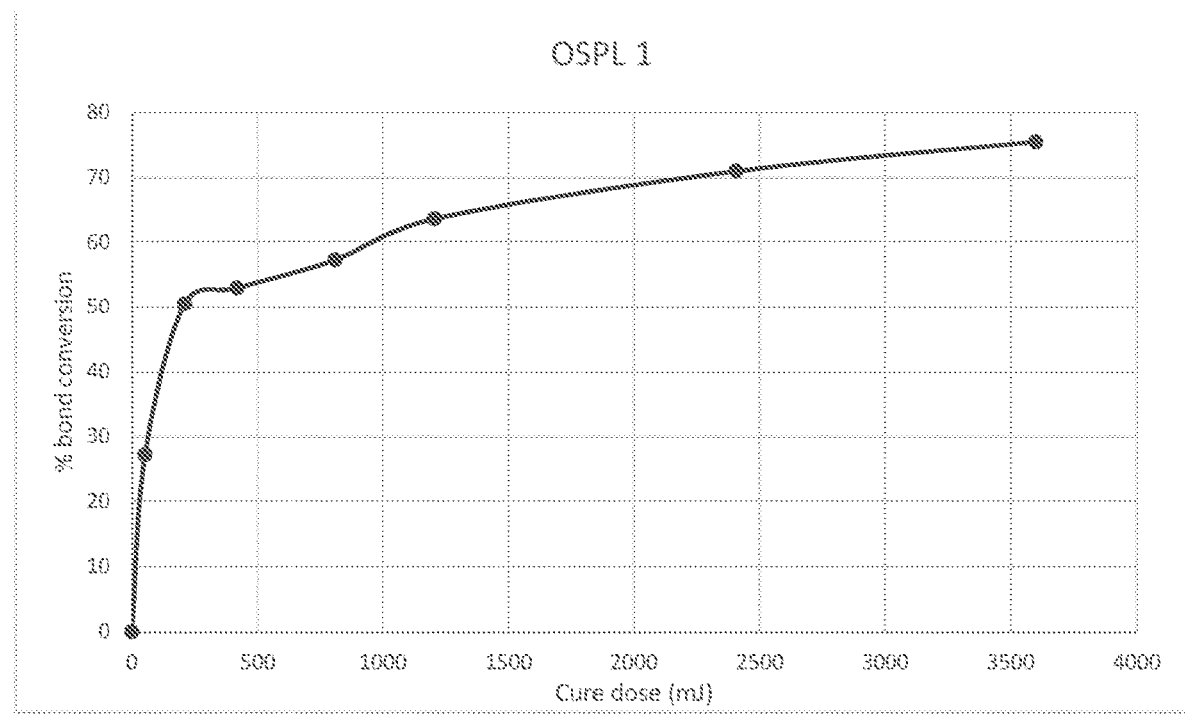
FIG. 1: Cure conversion curve for OSPL-1
FIG. 2; cure conversion curve for OSPL-2
Figure 2:
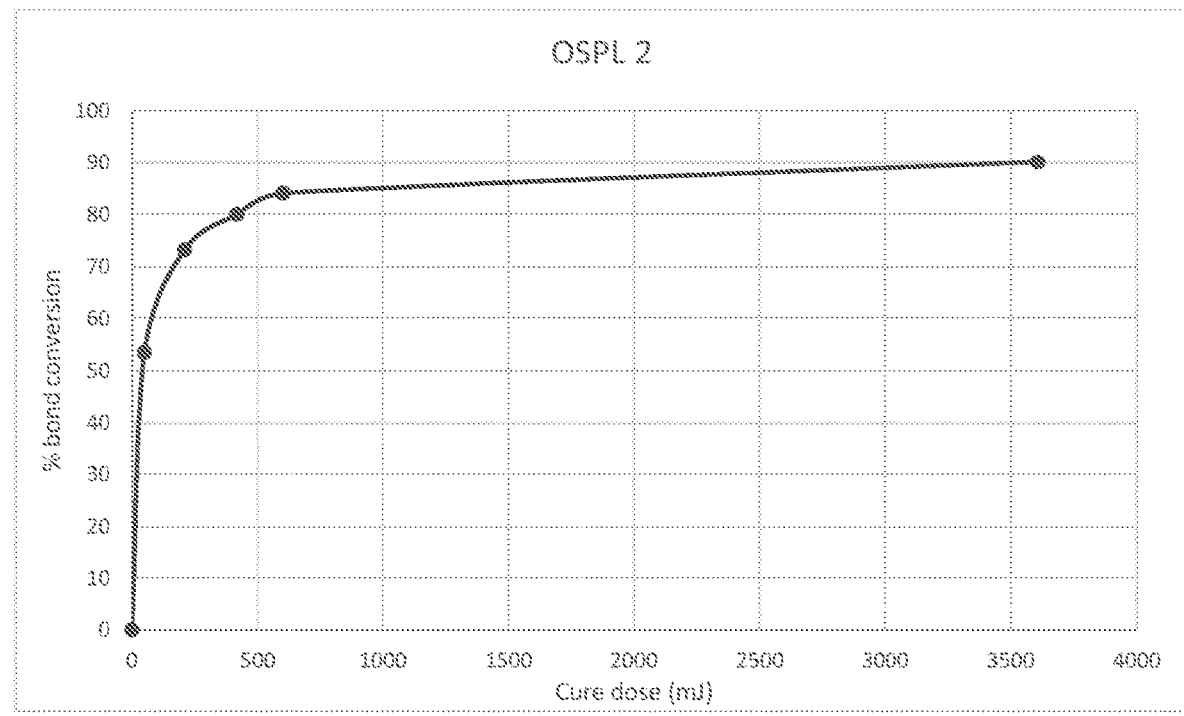
Figure 3:
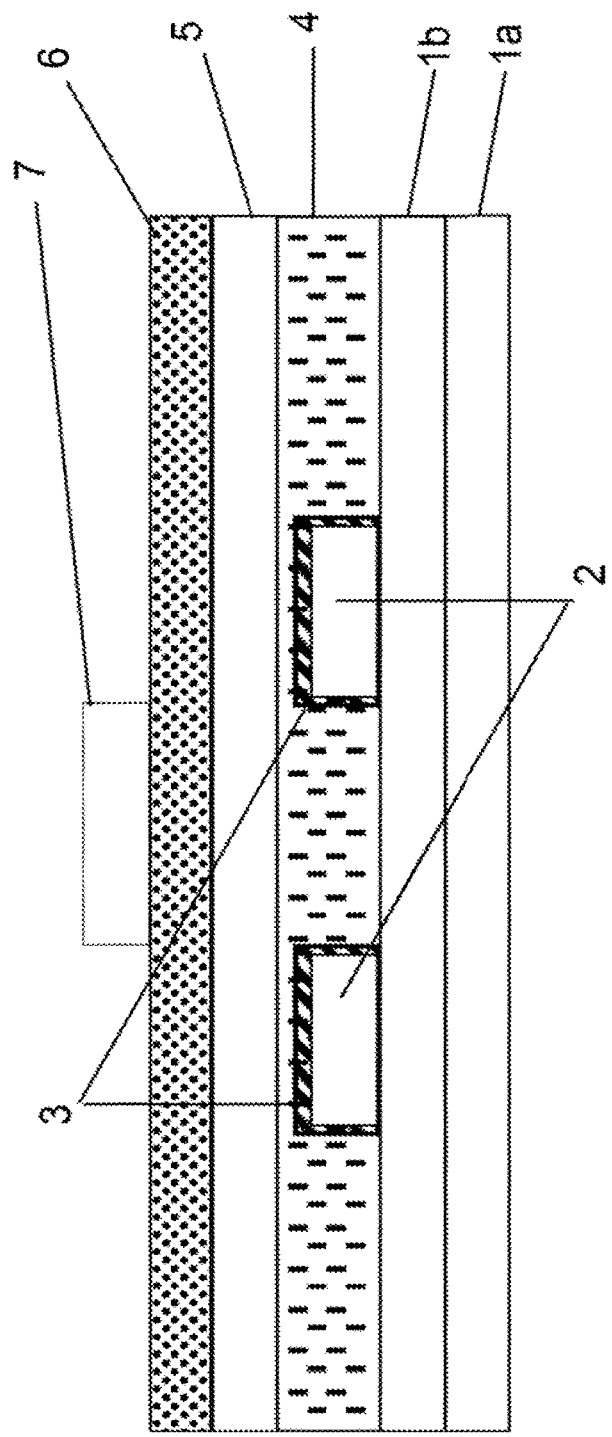
FIG. 3: TGBC (Top gate, bottom contact TFT) with high permittivity OSPL with the following key: 1*a* Substrate; 1*b* Base layer; 2 Electrodes (Source & Drain); 3 Electrode surface treatment/SAM; 4 Organic Semiconductor Layer (OSC); 5 Insulator (OGI); 6 Protection Layer (OSPL); 7 Gate Electrode(s).

Preferably, the organic gate insulator (OGI) layer comprises a low permittivity polymer having a dielectric constant (k)<3.0 @ 1000 Hz, for example a perfluoropolymer. As used herein, low k means a dielectric constant of less than 3.0 when measured at 1000 Hz, preferably less than 2.8, preferably less than 2.5. Preferably, the low dielectric constant (k) polymer has a dielectric constant in the range of 1.0 to 3.0. In the invention, high permittivity means >3.3, more preferably >3.5, more preferably >4.0 @1000 Hz.

Preferably, the OSPL has a permittivity (k)>3.3 @ 1000 Hz, preferably k>3.5 and more preferably >4.0 at 1000 Hz. Where more than one OSPL is present, they may have different permittivity to one another. This may be affected by virtue of their relative chemical composition.

Some examples of low permittivity polymers preferably include perfluoropolymers, benzocyclobutene polymers (BCB), parylene, polyvinylidene fluoride (PVDF) polymers, cyclic olefin copolymers (e.g. norbornene, TOPAS™) polymers, adamantyl polymers, perfluorocyclobutylidene polymers (PFCB), polymethylsiloxane (PDMS), and mixtures thereof.

The crosslinkable OSPL is coated on top of the OGI using any solution coating technique, preferably including spin coating, spray coating, slot-die coating, ink jet printing. The OSPL is crosslinked to provide a continuous layer.

Preferably, the perfluoropolymer OGI is selected from the chemical class consisting of Cytop™, Hyflon™ and TEFLON AF™. These perfluoropolymers have the structures shown below.

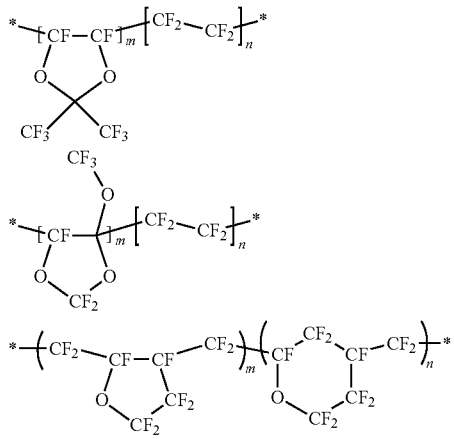

wherein * indicates the point of attachment of the repeat unit to the rest of the polymer and n is an integer (n being that conventionally used for such perfluoropolymers).

In one embodiment, Cytop is represented as a homopolymer of monomer on left had side of the structure above. Accordingly, preferably m=1 and n=0 for the Cytop example given above.

Preferred amorphous perfluorinated polymers are available from Du Pont (Teflon® AF), Asahi Glass (as Cytop®), and Solvay (as Hyflon® AD).

Teflon® AF and Hyflon® AD are copolymers of 2,2-bis (trifluoromethyl)-4,5-difluoro-1,3-dioxole (I) and 2,2-bis (trifluoromethyl)-4-fluoro-5-trifluoromethoxy-1,3-dioxole (II) with tetrafluoroethylene, respectively.

Cytop® 809M is a most preferred OGI material for use in the present invention.

These materials are all commercially available and their production is well known in the art.

The organic gate insulator (OGI) layer can be completely protected from sputter damage by the present invention and the resulting OTFTs retain their pre-sputter electrical characteristics.

The cross-linked protective organic layer of the present invention is preferably a free-radical photocured, cross-linked layer.

Preferably, the OSPL layer is in the range of 10-1000 nm thick, more preferably 10-250 nm thick, most preferably 100-500 nm thick. The thickness of the OSPL layer required depends upon the energy and duration of the plasma process used to deposit the gate metal. The higher the plasma energy, or the longer the exposure time, the thicker the required OSPL layer to provide protection from sputter damage. For example, sputter deposition of a gold gate metal (approx. 100 nm thick) requires an OSPL of only 100-250 nm thickness. Sputter yields of noble metals such as Au or Ag are 2-3 times higher than for Al or Mo. Therefore, to afford the same level of protection, thicker layers of OSPL (~400-500 nm) are required when depositing metals such as Al or Mo.

The OSPL is preferably obtainable by polymerising an ink composition comprising at least one multi-functional acrylate. The multi-functional acrylate should preferably be capable of cross-linking with other components of the ink.

The OSPL is preferably obtainable by solution coating said ink composition onto the OGI.

The OSPL preferably has a cross-link density in the range of 3 to 6H pencil hardness.

Preferably, the multi-functional acrylate contains a nitrogen-containing core having at least two pendant acrylate moieties.

The OSPL is preferably obtainable by polymerising an ink composition comprising (a1) a first multi-functional acrylate compound containing a nitrogen-containing core having at least two pendant acrylate moieties, and (a2) a second multi-functional acrylate compound having an oxy- or polyoxy-alkane core.

Both components (a1) and (a2) are preferably not silicone based, and are preferably not surfactants.

Preferably the multi-functional acrylate compound (a1) contains at least two pendant (acryloyloxy) ethyl moieties, preferably three pendant (acryloyloxy) ethyl moieties. The multi-functional acrylate compound may have up to six acrylate moieties.

Preferably the multi-functional acrylate compound (a1) of the OSPL comprises a nitrogen-containing core having at least two pendant acrylate moieties and is more preferably an isocyanurate core with at least two acrylate groups, preferably at least two (acryloyloxy)ethyl moieties, preferably three (acryloyloxy)ethyl moieties.

Specific preferred examples of the multi-functional acrylate compound (a1) of the OSPL are isocyanurate compounds selected from the group consisting of Tris (2-hydroxy ethyl) isocyanurate triacrylate, Photomer 5662 Amine modified polyether acrylate, Photomer 5930 Amine modified polyether acrylate, Sartomer CN550 and Sartomer CN503.

Preferably the multi-functional acrylate compound (a1) of the OSPL is tris[2-(acryloyloxy)ethyl] isocyanurate, having the following structure:

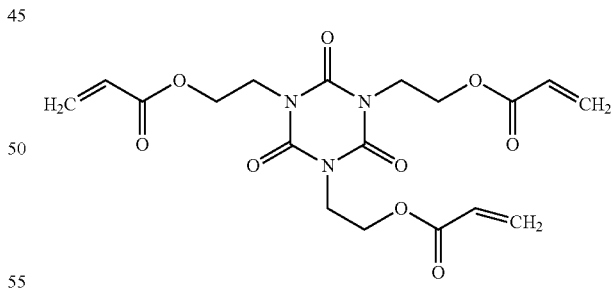

The multi-functional acrylate compound (a1) of the OSPL provides the required cross-link density of the cured layer. This component preferably has a high $T_g$ which imparts hardness to the layer.

The multi-functional acrylate monomer compound (a2) is used to provide fast cure, and to impart coating hardness and chemical resistance to the OSPL layer.

Preferably, the high reactivity monomer (a2) is a multi-functional acrylate compound having an oxy or polyoxyalkane core and at least two acrylate groups. More preferably an oxy- or polyoxy-$C_{2-24}$ alkane core, such as a polyoxy-$C_{4-12}$ alkane core. Some examples of (a2) acrylates include trimethylolpropane triacrylate, ditrimethylolpropane tetra-acrylate (DiTMPTA), dipentaerythritol hexaacrylate, pentaerythritol tetraacrylate, polyester hexaacrylate, dipentaerythritol hexaacrylate (DPHA) and multifunctional acrylate oligomers such as Photomer 5434 Polyester tetraacrylate, Photomer 5443 Polyester hexaacrylate, Photomer 5050 Multi-functional acrylate, Photomer 6628 Aliphatic urethane hexaacrylate, Photomer 6692 Aliphatic urethane hexaacrylate, and Cresol novolac epoxy acrylate.

Preferably, the monomer (a2) comprises a polyoxy-$C_{4-12}$ alkane core moiety having at least two pendant acrylate moieties, preferably three pendant acrylate moieties. Preferably, the monomer (a2) comprises a polyoxy-$C_{4-12}$ alkane core having three pendant acrylate moieties. The monomer (a2) may have up to six acrylate moieties.

Preferably, the multifunctional acrylate monomer (a2) comprises (is) trimethylolpropane triacrylate.

Preferably, the multifunctional acrylate monomer (a2) is highly reactive, thereby enabling a fast cure of the OSPL in both surface and bulk cure.

The combination of monomers (a1) and (a2) enable a high degree of cross linking.

In addition, it is preferable that the OSPL ink further includes a relatively high viscosity component, so that once it has been coated onto the OGI, the higher viscosity prevents the wet film from reticulating from the OGI surface.

It is preferable that after solvent evaporation from the OSPL ink the viscosity of the pre-cured OSPL layer should be >2000 cPs to prevent reticulation from the OGI surface. Therefore, preferably, the ink composition comprises a multi-functional acrylate oligomer having a viscosity of >3000 MPa·S. The multi-functional acrylate oligomer optionally comprises a bisphenol acrylate oligomer.

The OSPL is preferably obtainable by polymerising a composition according to the fourth aspect of the present invention. In a preferred embodiment, the ink comprises monomers (a1) and (a2), as defined above. The non-acrylate solvent (b) may be used to adjust the viscosity of the composition during preparation or in a coating operation, or to improve wetting with respect to a substrate to be coated.

Examples of the solvent (b) include aromatic hydrocarbons such as benzene, toluene, xylene, cumene, ethylbenzene, aliphatic hydrocarbons such as hexane, heptane, octane, petroleum ether, ligroin, cyclohexane and methylcyclohexane; halogenated hydrocarbons chlorobenzene and bromobenzene; alcohols such as methanol, ethanol, isopropanol, butanol, pentanol, hexanol, cyclopentanol, cyclohexanol, ethylene glycol, propylene glycol, propylene carbonate, glycerol, ethylene glycol monomethyl ether and diethylene glycol; ketones such as acetone, methyl ethyl ketone, methyl isobutyl ketone and cyclohexanone; ethers such as diethyl ether, dipropyl ether, butyl ethyl ether, dibutyl ether, ethylene glycol, propylene carbonate, dimethyl ether and diethylene glycol dimethyl ether; nitriles such as acetonitrile, propionitrile and capronitrile; and esters such as methyl formate, ethyl formate, methyl acetate, ethyl acetate, propyl acetate, isobutyl acetate, butyl acetate, pentyl acetate, methyl benzoate, ethyl benzoate, and lactones, such as gamma butyrolactone. Preferably the organic solvent comprises or consists of ethyl lactate.

The OSPL is preferably obtainable by polymerising a composition according to the fourth aspect of the invention.

The photo-cure mechanism should not result in ionic contaminants being present in the OTFT device. This means that photoresist materials that include photogenerated acids are not preferred The specific acrylate components of the OSPL are selected to be orthogonal to the underlying OGI layer, impart fast cure speed, provide excellent depth of cure and surface cure and most importantly to afford high cross-link density. Crosslink density is thought to correlate with resistance to sputter damage.

The organic semiconductor layer used in the present invention preferably comprises at least one semiconducting ink. Preferably, the ink comprises a small molecule polyacene and/or polytriarylamine binder formulation. Preferred semiconducting inks include those described in WO2010/0020329, WO2012/003918, WO2012/164282, WO2013/000531, WO2013/124682, WO2013/124683, WO2013/124684, WO2013/124685, WO2013/124686, WO2013/124687, WO2013/124688, WO2013/159863, WO2014/083328, WO2015/028768, WO2015/058827, WO2014/005667 WO2012/160383, WO2012/160382, WO2016/015804, WO2017/0141317, WO2018/078080.

Other OSC materials that can be used in this invention include discrete compounds, oligomers and derivatives of compounds of the following: conjugated hydrocarbon polymers such as of polyacene, polyphenylene, poly(phenylene vinylene), polyfluorene including oligomers of those conjugated hydrocarbon polymers; condensed aromatic hydrocarbons such as tetracene, chrysene, pentacene, pyrene, perylene, coronene, diketopyrrolopyrroles, substituted benzothienobenzothiophenes (C8-BTBT), dinaphthothienothiophenes (DNTT) or substituted derivatives of these; oligomeric para substituted phenylenes such as p-quaterphenyl (p-4P), p-quinquephenyl (p-5P), p-sexiphenyl (p-6P), or soluble substituted derivatives of these; conjugated heterocyclic polymers such as poly(3-substituted thiophene), poly (3,4-bisubstituted thiophene), polybenzothiophene, polyisothianapthene, poly([Lambda]/-substituted pyrrole), poly(3-substituted pyrrole), poly(3,4-bisubstituted pyrrole), polyfuran, polypyridine, poly-1,3,4-oxadiazoles, polyisothianaphthene, poly([Lambda]/-substituted aniline), poly(2-substituted aniline), poly(3-substituted aniline), poly(2,3-bisubstituted aniline), polyazulene, polypyrene; pyrazoline compounds; polyselenophene; polybenzofuran; polyindole; polypyridazine; benzidine compounds; stilbene compounds; triazines; substituted metallo- or metal-free porphines, phthalocyanines, fluorophthalocyanines, naphthalocyanines, naphthalene diimides or fluoronaphthalocyanines; C60 and C70 fullerenes; A/.[Lambda]/'-dialkyl, substituted dialkyl, diaryl or substituted diaryl-1,4,5,8-naphthalenetetracarboxylic diimide and fluoro derivatives; [Lambda]/,[Lambda]/'-dialkyl, substituted dialkyl, diaryl or substituted diaryl 3,4, 9,10-perylenetetracarboxylicdiimide; bathophenanthroline; diphenoquinones; 1,3,4-oxadiazoles; 11,11,12,12-tetracyanonaptho-2,6-quinodimethane, [alpha],[alpha]'-bis(dithieno [3,2-b2',3'-d]thiophene); dithieno[2,3-d;2',3'-d]benzo[1,2-b, 4,5-b]dithiophene (DTBDT); poly dithienobenzodithiophene-co-diketopyrrdopyrrolebithiophene(PDPDBD); isoindigo-Bithiophene-(IIDDT-C3), thieno[3,2-b]thiophene-5-fluorobenzo[c][1,2,5]thiadiazole copolymers, di(thiophen-2-yl)thieno[3,2-b]thiophene (DTTT); 2,8-dialkyl, substituted dialkyl, diaryl or substituted diaryl anthradithiophene; 2,2'-bibenzo[1,2-b;4,5-b']dithiophene, benzothienobenzothiophene (BTBT) polymers benzodithiazole polymers, and mixtures thereof.

Preferred compounds are those from the above list and derivatives thereof which are soluble.

The OSPL is preferably produced from a composition according to the fourth aspect of the invention, comprising: (a1) multi-functional acrylate compound(s); (a2) high reactivity monomer(s); (b) an organic solvent; (c) a fluoropolymer surfactant and an acrylate- and/or methacrylate-functionalised silicone surfactant, and (d) at least one photo-initiator.

The amount of multi-functional acrylate (a1) and optionally (a2) in the final layer is preferably 10-99%, more preferably 20-99% weight % of the final OSPL.

The organic solvent (b) is preferably substantially removed from the final OSPL, hence it preferably remains in less than 0.5 weight % of the final OSPL.

Generally, the amount of the initiator (d) used in the polymerisable composition is about 0.01 to about 25 weight %, preferably about 5 to about 20 weight %, most preferably about 8 to about 15 weight % of the polymerisable composition.

Preferably, the thin film transistor of the second aspect of the present invention is a Top Gate device. Said device of the second aspect of the invention preferably has improved electrical characteristics (low Vth, low Vto, low SS, low Ioff and high Ion/off ratios). It further optionally comprises one or more of a planarisation layer, a self-assembled monolayer. Such a device is shown in FIG. 1.

The OSPL is preferably obtainable by polymerising a composition comprising:
- (a) a multi-functional acrylate compound;
- (b) a non-acrylate organic solvent;
- (c) a surfactant composition comprising a fluoropolymer surfactant and an acrylate- and/or methacrylate-functionalised silicone surfactant;
- (d) at least one photo-initiator; and
- (e) optionally an acrylate-functionalised oligomer.

The OSPL is preferably obtainable by polymerising a composition comprising:
- (a1) a multi-functional acrylate compound having a nitrogen-containing cyclic core and at least two pendant acrylate moieties;
- (a2) a monomer having a polyacrylate monomer having an oxy or polyoxy-alkane core and at least two pendant acrylate moieties;
- (b) a non-acrylate organic solvent;
- (c) a surfactant composition comprising a fluoropolymer surfactant and an acrylate- and/or methacrylate-functionalised silicone surfactant;
- (d) at least one photo-initiator; and
- (e) optionally an acrylate-functionalised oligomer.

The OSPL is preferably obtainable by polymerising a composition comprising:
- (a1) 100 parts by weight of a multi-functional acrylate compound having a nitrogen-containing cyclic core and at least two pendant acrylate moieties;
- (a2) 5-1000 parts by weight of a polyacrylate monomer having a polyoxy-alkane core and at least two pendant acrylate moieties;
- (b) 1-10000 parts by weight, per 100 parts by weight of the components (a1) and (a2) combined of an organic solvent;
- (c) 0.01 to 20 parts by weight, per 100 parts by weight of the components (a1) and (a2) combined, a surfactant composition comprising a fluoropolymer surfactant and an acrylate- and/or methacrylate-functionalised silicone surfactant; and
- (d) 0.01 to 20 parts by weight, per 100 parts by weight of the components (a) and (b) combined, of at least one photo-initiator.

Preferably, the initiator compound (d) is selected from an amine-based initiator, a thioxanone-based initiator, and combinations thereof. Preferably, the initiator compound (d) comprises a benzoate compound, a substituted thioxanone compound or a combination thereof, preferably a combination of ethyl-4-(diamino) benzoate and diethylthioxanone, or a combination of ethyl-4-(diamino) benzoate and isopropylthioxanone.

Examples of effective OSPL formulations are included in tables 1, 2 and 3:

TABLE 1

| | | | | Surface tension (mN/m) | Surface energy of crosslinked film | Pencil Hardness (Method |
| Cas No. | Structure | Name (IGM Catalogue, not IUPAC) | % weight | (Pendant drop method) | (mN/m) | ASTM D3363) (500 nm film) |
| --- | --- | --- | --- | --- | --- | --- |
| 839-90-7 | | 1,3,5-Tris(2-hydroxyethyl) isocyanurate | 15.13 | 20.5 | 22 | 3H |

TABLE 1-continued

Formulation OSPL1

| Cas No. | Structure | Name (IGM Catalogue, not IUPAC) | % weight | Surface tension (mN/m) (Pendant drop method) | Surface energy of crosslinked film (mN/m) | Pencil Hardness (Method ASTM D3363) (500 nm film) |
|---|---|---|---|---|---|---|
| 15625-89-5 | | Trimethylolpropane triacrylate | 7.14 | | | |
| 687-47-8 | | Ethyl lactate | 73.08 | | | |
| 10287-53-3 | | Ethyl-4-(dimethylamino) benzoate | 1.82 | | | |
| 82799-44-8 | | 2,4-Diethyl-9H-thioxanthen-9-one | 1.82 | | | |
| | Silicone acrylate surfactant | OMNIVAD 280 | 0.97 | | | |
| | Nonionic oligomer with fluoro and lipophilic groups | DIC- Megaface F-563 | 0.05 | | | |

TABLE 2

Formulation OSPL2 used to deposit 200 nm layer of OSPL

| Cas No. | Structure | Name (IGM Catalogue, not IUPAC) | % weight | Surface tension (mN/m) (Pendant drop method) | Surface energy of crosslinked film (mN/m) | Pencil Hardness (Method ASTM D3363) (200 nm film) |
|---|---|---|---|---|---|---|
| 15625-89-5 | Reaction products of 2-ethyl-2-(hydroxymethyl) propane-1,3-diol and oxirane and acrylic acid and 2-aminoethanol | Photomer 5930 | 10.12 | 25 | 26 | 6H |

TABLE 2-continued

Formulation OSPL2 used to deposit 200 nm layer of OSPL

| Cas No. | Structure | Name (IGM Catalogue, not IUPAC) | % weight | Surface tension (mN/m) (Pendant drop method) | Surface energy of crosslinked film (mN/m) | Pencil Hardness (Method ASTM D3363) (200 nm film) |
|---|---|---|---|---|---|---|
| 687-47-8 | *(structure of ethyl lactate)* | Ethyl Lactate | 88.56 | | | |
| | Silicone acrylate surfactant | OMNIVAD 280 | 0.44 | | | |
| 10287-53-3 | *(structure of ethyl-4-(dimethylamino)benzoate)* | ethyl-4-(dimethylamino) benzoate | 0.55 | | | |
| 82799-44-8 | *(structure of 2,4-diethyl-9H-thioxanthen-9-one)* | 2,4-Diethyl-9H-thioxanthen-9-one | 0.33 | | | |

TABLE 3

Formulation OSPL2-1, used to deposit 500 nm thick layer of OSPL

| Cas No. | Structure | Name | % weight | Surface tension (mN/m) (Pendant drop method) | Surface energy of crosslinked film (mN/m) | Pencil Hardness (Method ASTM D3363) (200 nm film) |
|---|---|---|---|---|---|---|
| 15625-89-5 | Reaction products of 2-ethyl-2-(hydroxymethyl propane-1,3-diol and oxirane and acrylic acid and 2-aminoethanol | Photomer 5930 | 14.64 | 25 | 26 | 6H |
| 687-47-8 | *(structure of ethyl lactate)* | Ethyl Lactate | 83.44 | | | |
| | Silicone acrylate surfactant | OMNIVAD 280 | 0.637 | | | |
| 10287-53-3 | *(structure of ethyl-4-(dimethylamino)benzoate)* | ethyl-4-(dimethylamino) benzoate | 0.8 | | | |

TABLE 3-continued

Formulation OSPL2-1, used to deposit 500 nm thick layer of OSPL

| Cas No. | Structure | Name | % weight | Surface tension (mN/m) (Pendant drop method) | Surface energy of crosslinked film (mN/m) | Pencil Hardness (Method ASTM D3363) (200 nm film) |
|---|---|---|---|---|---|---|
| 82799-44-8 |  | 2,4-Diethyl-9H-thioxanthen-9-one | 0.48 | | | |

For cost and ease of fabrication, it is desirable to solution coat the OSPL onto the gate insulator, some suitable coating techniques include but is not limited to spin coating, slot-die coating or ink jet printing. However, the very low surface free energy of the perfluoropolymer (11-20<dyne/cm) means that it is preferable to modify the surface tension of the OSPL ink formulation before coating takes place.

Preferably the formulated OSPL ink has a surface tension in the range of 18 to 35 mN/m, more preferably 20 to 30 mN/m, more preferably 19 to 28 mN/m.

In one embodiment, the OSPL composition is modified to reduce its surface tension by addition of a surfactant composition comprising a fluoropolymer surfactant and a silicone surfactant. Preferably, less than 2 wt % of surfactants are included in the ink composition, more preferably less than 1 wt. %. The surfactant is preferably compatible with the acrylate-based OSPL composition.

Preferred surfactants include fluorosurfactants and acrylate and/or methacrylate-functionalised silicone surfactants. Particularly preferred are non-ionic fluorosurfactants, particularly, non-ionic perfluorosurfactants.

Preferred surfactants are those having a 0.1% solution surface tension (mN/m) in toluene of less than 24 mN/m, preferably less than 23 mN/m, preferably 21 mN/m.

Preferably the surfactant-containing-OSPL composition is solution deposited on to the gate insulator layer and any optional solvent is removed by thermal evaporation. The resultant layer is then crosslinked.

Once the OSPL layer is in place (~10-500 nm thick layer), a metal gate can be deposited on to it using a plasma sputter process. Testing of the resulting OTFT devices indicates that with the OSPL in place, there is zero to minimal deterioration of transistor performance after plasma exposure, therefore the OSPL has protected the OTFT from plasma-induced damage.

Experimental

1. Preparation of OSPL/OGI/OSC/Glass Substrates to Assess Coating Uniformity, Cure and Surface Free Energy OSPL screening experiments were carried out using glass substrates coated with OSC/OGI onto which the OSPL was over coated and cured. Microscope slides (50 mm×50 mm) were cleaned, plasma etched and treated with β-phenylethyl-trichlorosilane. These were then coated with a 25 μm layer of SKL09 organic semiconductor (SKL09 ink comprises 1.7% solids 30:70 wt:wt TMTES: Methoxy-PTAA in tetralin) followed by a 500 μm layer of Cytop 809M. The composite stack with CYTOP/OSC/Glass was then overcoated with sputter protective layer ink formulations which were UV-cured and assessed for degree of coverage and uniformity of film. Highly crosslinked, uniform OSPL films were obtained.

The detailed experimental method is detailed below:

1a. Preparation of Glass Substrates

The glass slides were prepared as follows:

Glass slides cut to 5 cm×5 cm and washed with acetone for 10 sec followed by IPA for 10 sec; dried with compressed $N_2$ gas and baked at 120° C. for 5 min. Cooled for 2 mins at room temperature on aluminium plate.

Plasma etched in Plasmalab PE 100 with 200 mbar base pressure, 250 mW power and 50 sccm flow rate of etch gasses (oxygen and argon). Dried with compressed $N_2$ to remove dust prior to coating. Glass treated with β-phenylethyl trichloro silane (B-PTS) solution in anhydrous toluene (25 mM (59.9 mg) of B-PETCS in 10 ml toluene). Solution flooded onto substrate, held for 2 minutes, spun off (60 sec 500 rpm, stop 10 sec and flood with toluene, spin at 500 rpm ramp to 1000 rpm while rinsing with more toluene). Heated the substrate at 100° C. for 1 min and then cooled tot RT for 1 min.

1b. Coating OSC Solution on Glass Substrate:

Dispensed 1 ml of semiconducting ink onto the substrate through a 0.45 μm filter to flood the whole surface. Cover with close fitting upturned bowl and spin coat using Laurell spin coater (500 rpm/5 s/500 rpms$^{-1}$ then at 1500 rpm/60 s/500 rpms$^{-1}$). Bake for 1 minute at 100° C. and cool for 1 minute on an aluminium plate 1c. Coating OGI (Organic Gate Insulator):

Dispensed ~1 ml of 4.5% solids solution of Cytop CTL 809M in FC43 solvent onto the substrate. Spin coat (500 rpm/5 s/500 rpms$^{-1}$ then 1500 rpm/20 s/6000 rpms$^{-1}$) heat for 90 sec at 50° C. and 1 min at 100° C.; cool for 1 minute on an aluminium plate.

1d. Coating and Cross-Linking the OSPL Layer:

Dispense organic sputter protection layer formulation (SPL 184/2+optionally fluorosurfactant) onto the substrate through a 0.45 μm filter. Spin coat (500 rpm/5 s/500 rpms⁻¹ then 1500 rpm/60 s/500 rpms⁻¹

Expose to between 300 to 3000 mJ/cm² UV light, i-line and then baked at 100° C. for 1 minute.

1e. Measurement of Film Thickness

Film thickness was determined with a DektakXT from Bruker Nano Surfaces Division.

1f. Measurement of Surface Free Energy of Film

Surface free energy was determined using the sessile drop technique with at least three solvents using a dataphysics OCA 15EC goniometer using the Owens, Wendt, Rabel and Kaelble model.

1g. Measurement of Surface Tension of Ink

Surface tension was determined using the pendant drop technique and a dataphysics OCA 15EC goniometer.

1h. Determination of Percentage C=C Bond Conversion by FTIR

Record FTIR spectra (Perkin Elmer Spectrum 2 instrument with diamond ATR module) for the wet uncured film prior to any UV exposure and for a series of films that have been cured to varying degrees by incremental UV exposure. Accurately baseline the spectra at three points using the troughs surrounding the absorption peaks of interest. These are typically around 1846, 1657 and 1573 cm⁻¹ wave numbers. Measure the height of the carbonyl peak at 1725 cm⁻¹ and the alkene peak at 1635 cm⁻¹. Calculate the ratio of the absorbance at 1635 cm⁻¹ to the absorbance at 1725 cm⁻¹ and compare with the ratio obtained for the uncured sample. Calculate the degree of cure using the following formula:

$$\text{Degree of cure (\%)} = \left(1 - \frac{\left(\frac{A_{1635}}{A_{1725}}\right)_t}{\left(\frac{A_{1635}}{A_{1725}}\right)_0}\right) \times 100$$

2. Preparation of OTFT Arrays

FIG. 1 depicts a top gate bottom contact (TGBC) OTFT comprising the following components:

Substrate (1)

Source and drain electrodes (2)

An (optional) electrode surface treatment (3) or Self Assembled Monolayer (SAM)

An organic semiconductor layer (OSC, 4)

An organic gate insulator layer (OGI, 5)

An organic sputter protection layer (6)

A gate electrode (7)

Figure 4:
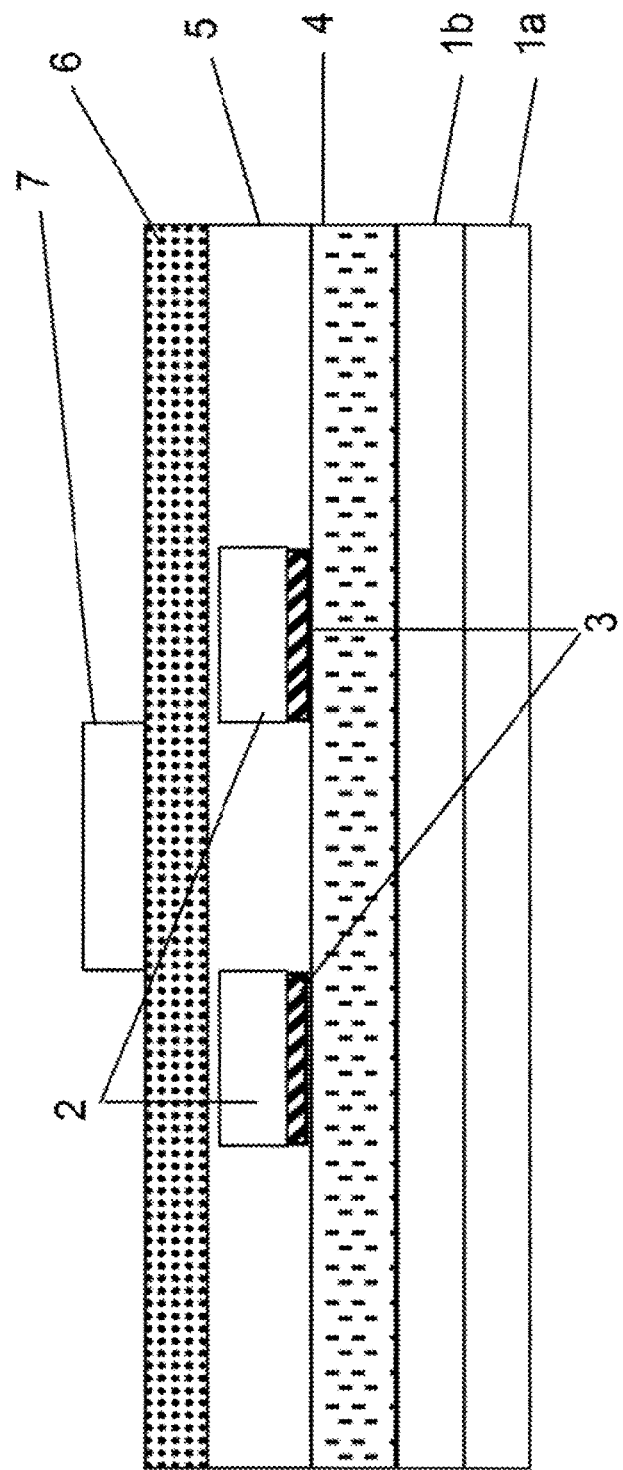
FIG. 4: TGTC (Top gate, top contact TFT) with high permittivity OSPL with the following key: 1*a* Substrate; 1*b* Base layer; 2 Electrodes (Source & Drain); 3 Electrode surface treatment/SAM; 4 Organic Semiconductor Layer (OSC); 5 Insulator (OGI); 6 Protection Layer (OSPL); 7 Gate Electrode(s).
Figure 5:
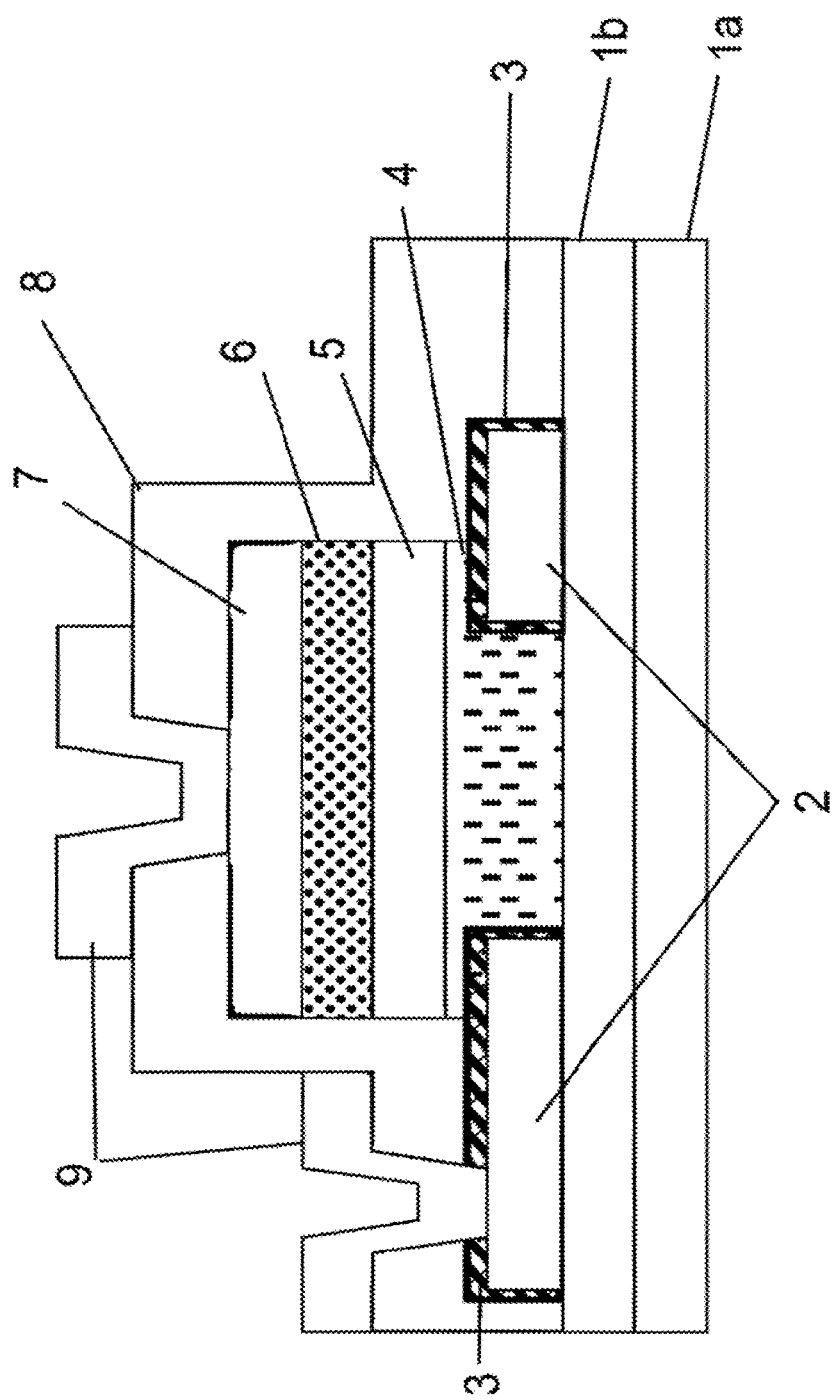
FIG. 5: TGBC (Top gate bottom contact TFT) with OSPL (6), base layer (1*b*), passivation layer (8) and metal interconnect (9) with the following key: 1*a* Substrate; 1*b* Base layer; 2 Electrodes (Source & Drain); 3 Electrode surface treatment/SAM; 4 Organic Semiconductor Layer (OSC); 5 Insulator (OGI); 6 Protection Layer (OSPL); 7 Gate Electrode(s); 8 Passivation layer; 9 Metal interconnect.
Figure 6:
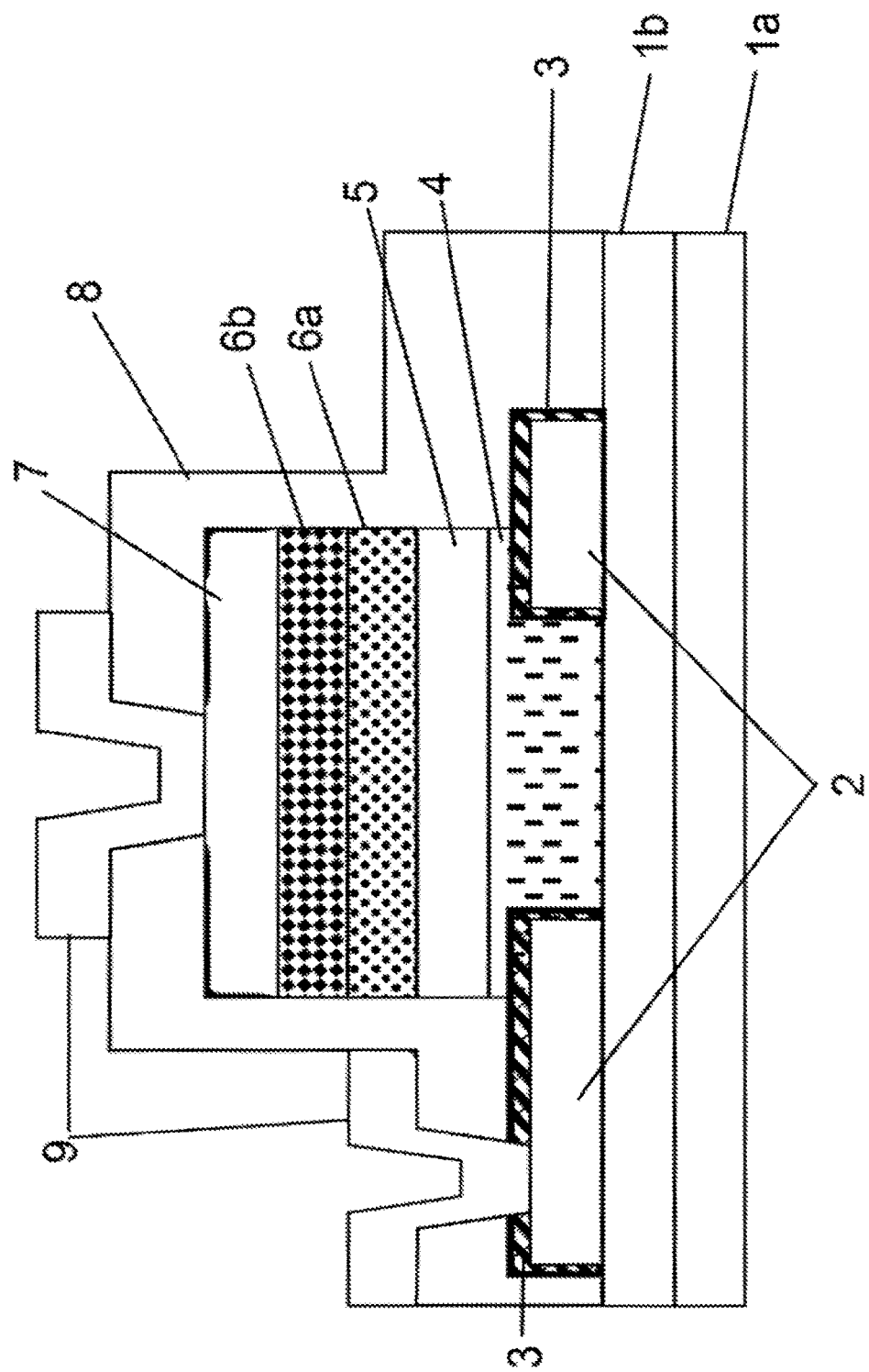
FIG. 6: TGBC (Top gate bottom contact TFT) with two OSPL layers 6*a* and 6*b*, base layer (1*b*), passivation layer (8) and metal interconnect (9)) with the following key: 1*a* Substrate; 1*b* Base layer; 2 Electrodes (Source & Drain); 3 Electrode surface treatment/SAM; 4 Organic Semiconductor Layer (OSC); 5 Insulator (OGI); 6*a* Protection Layer 1 (OSPL-1); 6*b* Protection Layer 2 (OSPL-2); 7 Gate Electrode(s); 8 Passivation Layer; 9 Metal Interconnect.
Figure 7:
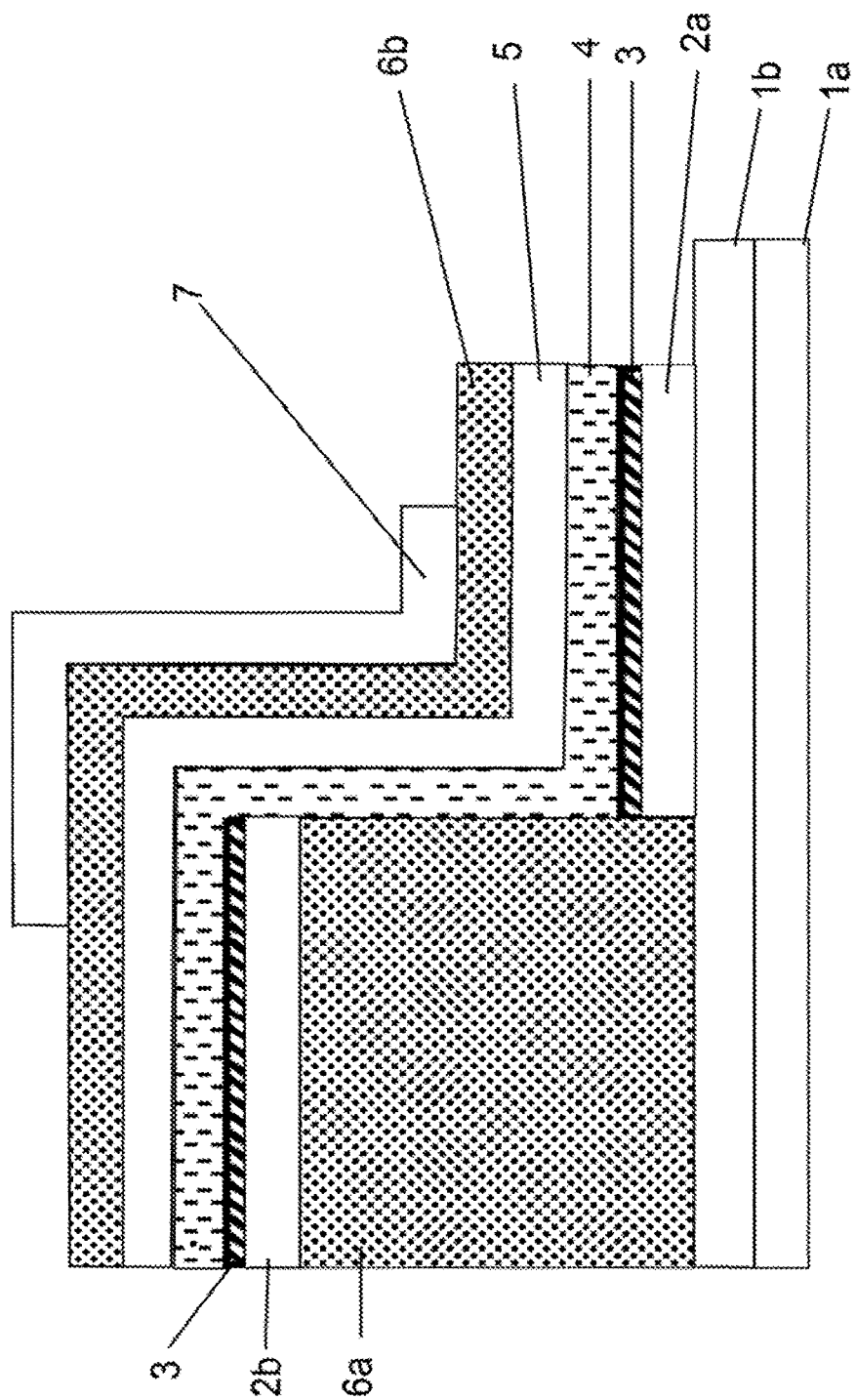
FIG. 7: SmartKem vertical TFT with high permittivity OSPL with the following key: 1*a* Substrate; 1*b* Base layer; 2*a* Electrodes (Source or Drain); 2*b* Electrodes (Source or Drain); 3 Electrode surface treatment/SAM; 4 Organic Semiconductor Layer (OSC); 5 Insulator (OGI); 6*a* Protection Layer 1 (OSPL-1); 6*b* Protection Layer 2 (OSPL-2); 7 Gate Electrode(s).
Figure 8:
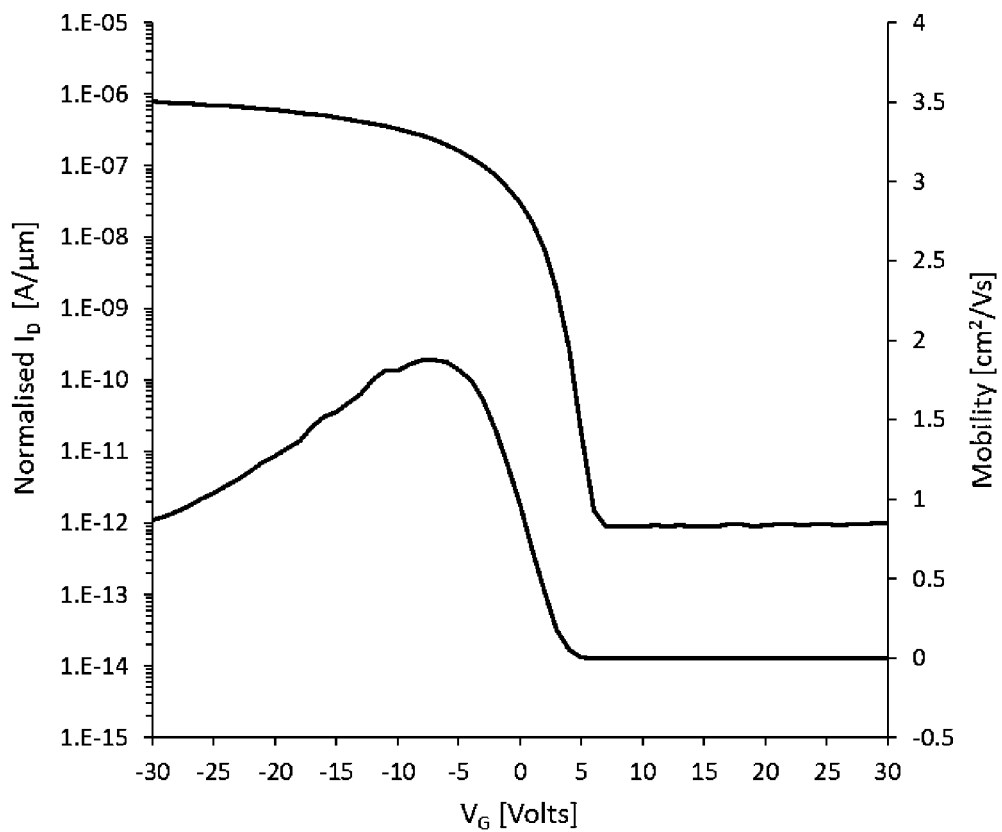
FIG. 8: Linear transfer and mobility plot for OTFT array SKBL748 with 120 nm OGI/200 nm OSPL and 50 nm evaporated Au gate.
Figure 9:
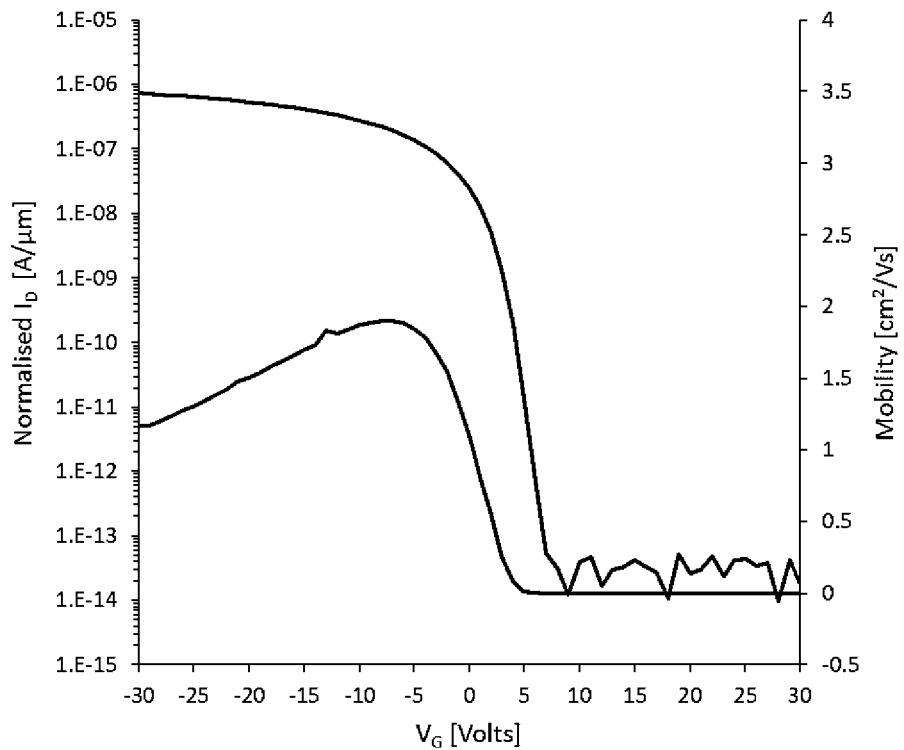
FIG. 9: Linear transfer and mobility plot for OTFT devices SKBL755 120 nm OGI/200 nm OSPL and 50 nm sputtered Au gate.
Figure 10:
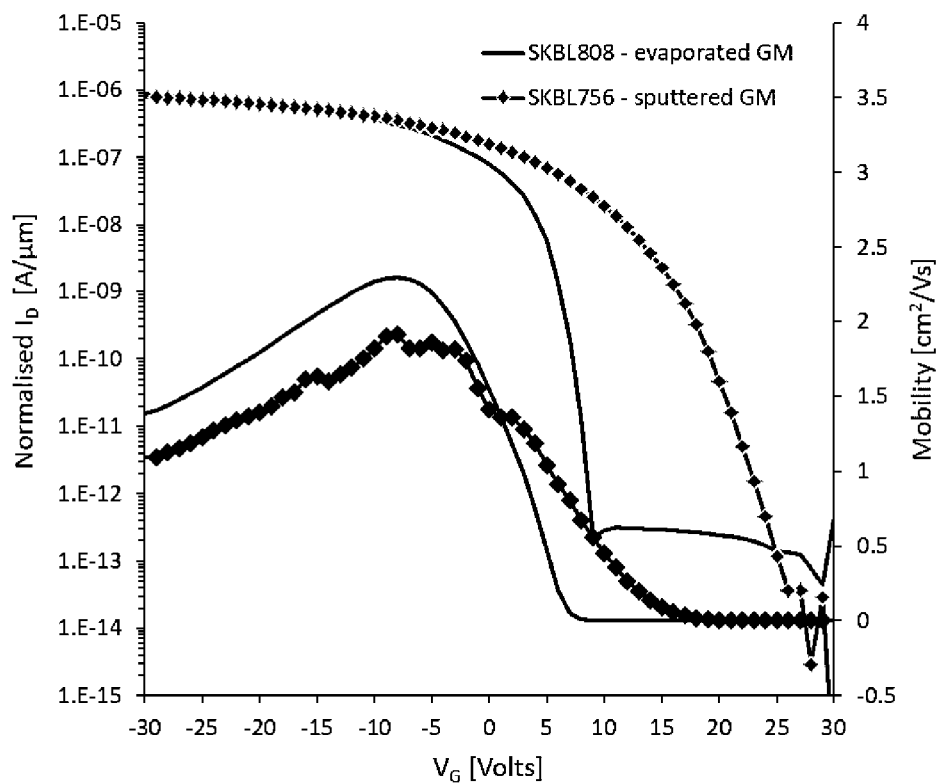
FIG. 10: Linear transfer and mobility plots for OTFT devices without OSPL layer. SKBL808 has 50 nm evaporated Au gate, SKBL756 has sputtered 50 nm Au gate.
Figure 11:
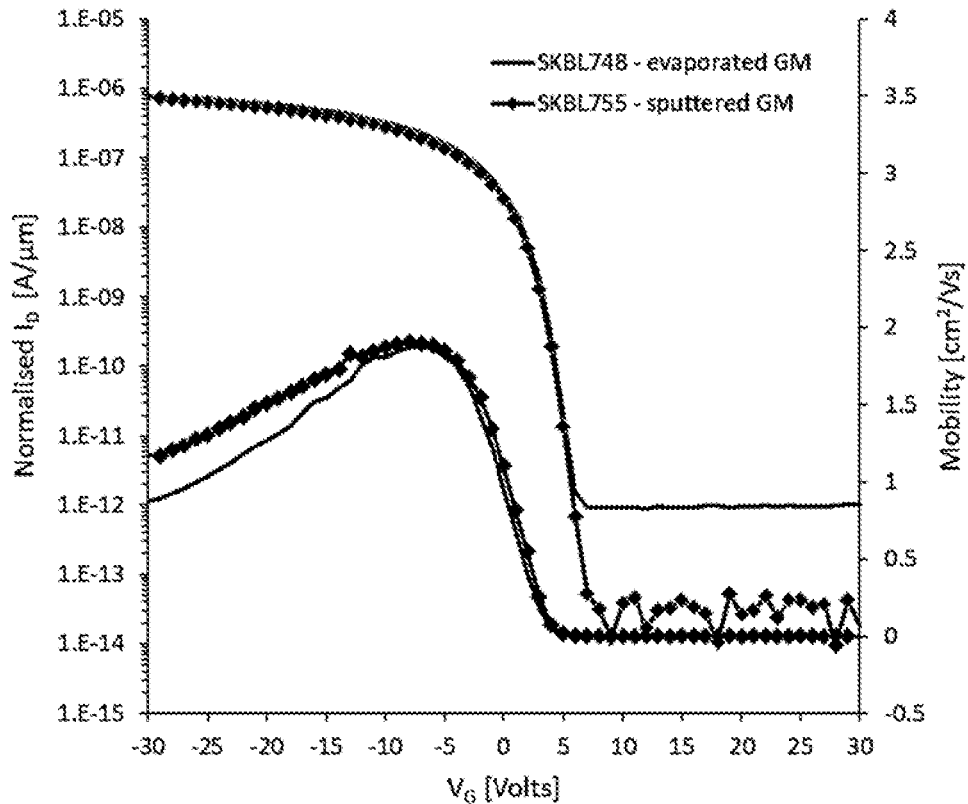
FIG. 11: Linear transfer and mobility plots for devices with 120 nm OGI/200 nm OSPL1. SKBL748 has evaporated Au gate, SKBL755 has sputtered Au gate.

The process steps to fabricate TGBC OTFTs comprise patterning source and drain electrodes (2) on top of the substrate, optionally applying an electrode surface treatment (3), applying an OSC layer (4) to cover the substrate (1) and source and drain electrodes (2), applying an OGI layer (5) on top of the OSC layer (4), coating the OSPL (6) on top of the OGI layer (5), crosslinking the OSPL layer (6), applying a gate electrode (7) on top of the OSPL. A layer of photoresist (8) is deposited on top of the gate electrode (7) and patterned to provide a mask for defining the gate electrode (7). Those parts of the OSPL, OGI and OSC layers (6), (5) and (4) respectively surrounding the gate electrode (7) are optionally removed, but the OSPL is always left intact within the channel region as in FIG. 4.

2a. Experimental Method: Coating onto Glass Substrates

TGBC OTFTs in the examples described below were fabricated using the following process steps:

1. Corning Eagle 2000 glass substrates were cleaned by sonication in a 5% solution of Decon 90 in de-ionised water for 20 min, rinsed with deionised water and dried in a convection oven at 70° C. for 30 min.
2. Following plasma treatment (50 sccm O₂, 70 W, 1.5 min, Oxford Instruments PLasmaLab 80+) a base layer, comprising 500 nm SU-8 2000 series (MicroChem), was spin coated onto the substrate at 3000 rpm for 25 sec.
3. The base layer was initially heated on a hotplate at 95° C. for 1 min, exposed to i-line radiation (400 mJ/cm²), post exposure baked at 95° C. for 1 minute and subsequently hard baked at 200° C. for 15 min.
4. 50 nm Au source and drain electrodes were sputtered (Ar gas, process pressure 10 mTorr, 200W RF power) and patterned using standard photolithography and wet etching techniques.
5.
6. Substrates were subjected to a O₂/He plasma (15 sccm O₂, 50 sccm He, 60W) treatment for 3 mins (Alpha Plasma, AL76) to increase the surface energy of the base layer and clean any residue from the patterned gold electrodes. A SAM layer, 10 mM pentafluorobenzenethiol (PFBT) solution in electronic grade 2-propanol, was formed by spin coating (speed and duration), rinsing twice with 2-propanol and heating at 100° C. for 1 min on a hotplate.
7. The OSC layer was spin coated (1250 rpm for 2 min) then baked at 100° C. for 1 min.
8. The OGI layer was formed by spin coating a solution of the insulator Cytop (AGC) at 1500 rpm for 20 sec.
9. The OGI was then heated on a hotplate at 85° C. for 1 min.
10. The OSPL was applied by flooding the device and spin coating at 1500 rpm for 2 min, flood exposing to 2.4 J/cm² UV (i-line), then heated a hotplate at 120° C. for 2 min.
11. A 50 nm Au gate electrode was sputtered (Ar gas, process pressure 10 mTorr, 200W RF power) and patterned following standard photolithographic and wet etching processes.

OTFT characteristics were obtained by biasing the gate and drain electrodes of the transistor relative to the source electrode. All example transistors comprise a p-type organic semiconductor such that when a negative gate voltage, $V_G$, is present holes (positive charge carriers) are accumulated at the interface between the OGI and OSC, forming a channel. A negative voltage, $V_D$, applied to the drain electrode causes a current, $I_D$, to flow dependent on charge carrier density, mobility, p, channel length, L, and width, W, as described by the equation when the OTFT is biased in the linear regime (i.e. $V_D < V_G$)

$$I_D = \frac{\mu W C_i}{L}\left(V_G - V_{th} - \frac{V_D}{2}\right)V_D + I_L \qquad \text{Equation 1}$$

$V_{th}$ is the threshold voltage and $I_L$ is the leakage current. $C_i$ is the capacitance per unit area of the OGI or OGI/OSPL layer beneath the gate, which determines the charge carrier density in the channel.

Electrical measurements were obtained using a Keithley 4200 SCS parameter analyser coupled to a Wentworth S200 probe station. To measure a device in the linear regime, the drain voltage was set to −2 V, and the gate voltage swept from +30V to −30V in 1V steps.

Field effect mobility was calculated according to Equation 2:

$$\mu = \frac{L}{W C_i V_D} \frac{\partial I_D}{\partial V_D} \quad \text{Equation 2}$$

where $\partial I_D/\partial V_D$ is the gradient of the $I_D$-$V_G$ plot. Note that where mobility is gate voltage dependent, the value quoted is the maximum recorded in accumulation with $V_D<V_G$.

Threshold voltage, $V_{th}$, and turn-on voltage, $V_{to}$, are both extracted from the normalised drain current, $NI_D=I_D \times L/W$, and is defined as the gate voltage when $NI_D=1$ nA ($10^{-9}$ A) for $V_{th}$ and 1 pA ($10^{-12}$ A) for $V_{to}$.

The off current, $I_{off}$, of the transistor is taken as the lowest current recorded during the gate voltage sweep. $I_{on/off}$ is calculated by dividing the drain current at $V_G=-30V$ by $I_{off}$.

Permittivity

Permittivity of the OSPL was determined by fabricating metal insulator metal (MIM) capacitors. 3×5 arrays MIM capacitors were fabricated as outlined below:

1. 25 mm×25 mm substrates were cleaved from silicon wafers, then rinsed with acetone and 2-propanol, baked on a hotplate for 10 min at 150° C. and finally exposed for 5 min to a $O_2$ plasma (25 sccm, 250 W, Diener Nano)
2. OSPL formulations were spin-coated at 1500 rpm for 2 min.
3. The device was exposed to 2.4 J/cm² i-line radiation (EVG 620), then baked at 120 C for 5 min.
4. Each array of 3×5 MIM capacitors was then formed by evaporating 80 nm Au through a shadow mask.

Thus, MIM capacitors with two layers of dielectric are formed, the first layer consisting 300 nm of thermal oxide, the second formed by the OSPL. The thickness of the OSPL is dependent on spin coating conditions and solids content of the formulation. For a two-layer capacitor the capacitance, C, is defined as the series sum of the oxide, $C_{OX}$, and OSPL, $C_{SPL}$, capacitances:

$$C = \frac{C_{OX} C_{SPL}}{C_{OX} + C_{SPL}} \quad \text{Equation 3}$$

Wherein:

$$C_{OX}=\varepsilon_0 \varepsilon_{OX} A/d_{OX} \quad \text{Equation 4}$$

$$\text{And } C_{SPL}=\varepsilon_0 \varepsilon_{SPL} A/d_{SPL} \quad \text{Equation 5}$$

$\varepsilon_{OX}$, $d_{OX}$, $d_{SPL}$ and $\varepsilon_{SPL}$ are the relative permittivities and thicknesses of the oxide and OSPL layers respectively, A, the area of the capacitor and $\varepsilon_0$ is the permittivity of free space.

The permittivity of the OSPL can be extracted from equations 3, 4 and 5:

$$\varepsilon_{SPL} = \frac{C C_{OX}}{(C_{OX} - C)} \frac{d_2}{\varepsilon_0 A}$$

Capacitance of each MIM device was measured at a frequency of 1 kHz, 200 mV$_{P-P}$, using an Agilent 4264 Precision LCR meter. OSPL and oxide thicknesses were measured with a J. A. Woollam M2000 Variable Angle Spectroscopic Ellipsometer at wavelengths 300-1500 nm and incident angles from 55° 75°. Areas of each MIM device was measured using a calibrated Nikon microscope.

TABLE 4

Permittivity of Organic Sputter Protective Layer

| OSPL | Number of devices | $d_{SPL}$ [nm] | Area [cm²] | Permittivity | S. Dev |
|---|---|---|---|---|---|
| OSPL1 | 12 | 243 | 0.101 | 4.58 | 0.03 |
| OSPL1 | 15 | 251 | 0.105 | 4.60 | 0.05 |
| OSPL2 | 15 | 526 | 0.102 | 4.99 | 0.12 |
| OSPL2 | 15 | 498 | 0.102 | 5.03 | 0.06 |

TABLE 5

Experimental results reporting mobility, Vth, Vto subthreshold values, On/Off ratios measured for devices with evaporated and sputtered gates both with and without the OSPL. OTFT Output curves for SKBL748, SKBL756, SKBL749 and SKBL755 are also provided in FIGS 5, 6, 7 and 8.

| Device Identity | L [μm] | W [μm] | OGI [nm] | OSPL | OSPL thickness [nm] | Gate Deposition Method | Mobility [cm²/Vs] | Vth [V] | Vto [V] | Subthreshold Swing [V/decade] | On/Off ratio |
|---|---|---|---|---|---|---|---|---|---|---|---|
| SKBL749 | 8 | 1068 | 270 | — | 0 | Evaporated | 2.3 | 8.0 | 11.8 | 1.3 | 4.82E+06 |
| SKBL756 | 8 | 1068 | 270 | — | 0 | Sputtered | 2.4 | 16.4 | 23.5 | 2.4 | 1.26E+05 |
| SKBL748 | 8 | 1068 | 120 | OSPL1 (SRL1) | 200 | Evaporated | 1.9 | 3.5 | 6.8 | 1.1 | 8.15E+05 |
| SKBL755 | 8 | 1068 | 120 | OSPL1 (SRL1) | 200 | Sputtered | 1.9 | 3.3 | 6.0 | 0.9 | 2.25E+07 |
| SKBL809 | 32 | 920 | 160 | OSPL2 (SRL2-1) | 200 | Sputtered | 1.4 | 5.5 | 11.6 | 2.0 | 7.20E+06 |
| SKBL810 | 16 | 1021 | 160 | OSPL2 (SRL2-1) | 350 | Sputtered | 1.6 | 4.8 | 11.0 | 2.0 | 7.55E+05 |
| SKBL811 | 32 | 920 | 160 | OSPL2 (SRL2-1) | 500 | Sputtered | 2.1 | 3.9 | 9.9 | 2.0 | 5.71e+05 |

The invention claimed is:

1. A thin film transistor, comprising a substrate, one or more source/drain electrodes, at least one gate electrode, an organic semiconductor layer, and an organic gate insulator (OGI) layer;
    wherein the organic gate insulator (OGI) layer has a dielectric constant (k)<3.0 @ 1000 Hz, said organic gate insulator layer being over-coated with a cross-linked organic layer (OSPL);
    wherein the cross-linked layer is a free-radical photocured layer;
    wherein the cross-linked organic layer thereon has a permittivity (k)>3.3 @ 1000 Hz;
    preferably wherein the cross-linked organic layer thereon has a permittivity (k)>3.5 at 1000 Hz;
    more preferably wherein the cross-linked organic layer thereon has a permittivity (k)>4.0 at 1000 Hz;
    wherein the cross-linked organic layer thereon is obtainable by polymerising a solution comprising at least one multi-functional acrylate, a fluorosurfactant and an acrylate and/or methacrylate-functionalised silicone surfactant, and one or more initiators;
    wherein the organic semiconductor layer comprises one or more material selected from the group consisting of tetracene, chrysene, pentacene, diketopyrrolopyrroles, substituted benzothienobenzothiophenes (C8-BTBT), dinaphthothienothiophenes (DNTT), pyrene, perylene, coronene, or substituted derivatives of these; oligomeric para substituted phenylenes such as p-quaterphenyl (p-4P), p-quinquephenyl (p-5P), p-sexiphenyl (p-6P), or soluble substituted derivatives of these, poly (3-substituted thiophene), poly(3,4-bisubstituted thiophene), polybenzothiophene, polyisothianapthene, poly([Lambda]/-substituted pyrrole), poly(3-substituted pyrrole), poly(3,4-bisubstituted pyrrole), polyfuran, polypyridine, poly-1,3,4-oxadiazoles, polyisothianaphthene, poly([Lambda]/-substituted aniline), poly(2-substituted aniline), poly(3-substituted aniline), poly(2,3-bisubstituted aniline), polyazulene, polypyrene; pyrazoline compounds; polyselenophene; polybenzofuran; polyindole; polypyridazine; benzidine compounds; stilbene compounds; triazines; substituted metallo- or metal-free porphines, phthalocyanines, fluorophthalocyanines, naphthalocyanines, naphthalene diimides or fluoronaphthalocyanines; C60 and C70 fullerenes; A/.[Lambda]/'-dialkyl, substituted dialkyl, diaryl or substituted diaryl-1,4,5,8-naphthalenetetracarboxylic diimide and fluoro derivatives; [Lambda]/.[Lambda]/'-dialkyl, substituted dialkyl, diaryl or substituted diaryl 3,4,9,10-perylenetetracarboxylic-diimide; bathophenanthroline; diphenoquinones; 1,3,4-oxadiazoles; 11,11,12,12-tetracyanonaptho-2,6-quinodimethane; [alpha], [alpha]'-bis(dithieno[3,2-b2',3'-d]thiophene); dithieno[2,3-d;2',3'-d']benzo[1,2-b;4,5-b']dithiophene (DTBDT); poly dithienobenzodithiophene-co-diketopyrrolopyrrolebithiophene (PDPDBD); isoindigo-Bithiophene-(IIDDT-C3), thieno[3,2-b]thiophene-5-fluorobenzo[c][1,2,5] thiadiazole copolymers, di(thiophen-2-yl)thieno[3,2-b] thiophene (DTTT); 2,8-dialkyl, substituted dialkyl, diaryl or substituted diaryl anthradithiophene; 2,2'-bibenzo[1,2-b:4,5-b'jdithiophene, benzothienobenzothiophene (BTBT) polymers benzodithiazole polymers, and mixtures thereof.

2. The thin film transistor of claim 1, wherein the OGI layer material is selected from the group consisting of perfluoropolymers, benzocyclobutene polymers (BCB), parylene, polyvinylidene fluoride (PVDF) polymers, cyclic olefin copolymers (e.g. norbornene), perfluoro cyclic olefin polymers, adamantyl polymers, perfluorocyclobutylidene polymers (PFCB), siloxane polymers (such as polymethylsiloxane), and mixtures thereof.

3. The thin film transistor according to claim 1, wherein the cross-linked organic layer thereon is 50-4000 nm thick.

4. The thin film transistor according to claim 1, wherein the surface free energy of OGI is 15-22 mN/m.

5. The thin film transistor according to claim 1, wherein the surface free energy of cross-linked-organic layer thereon is between 16-35 mN/m.

6. The thin film transistor according to claim 1, wherein the permittivity of the cross-linked organic layer on the OGI is ≥4.

7. The thin film transistor according to claim 1, wherein the cross-linked organic layer thereon is obtainable by polymerising a solution further comprising an acrylate functional oligomer and/or a non-acrylate organic solvent.

8. An electronic device comprising a thin film transistor according to claim 1.

9. The thin film transistor according to claim 2, wherein the surface free energy of the OGI is 15-22 mN/m.

10. A process for solution deposition of a cross-linkable organic layer on to a low surface energy organic gate insulator, wherein the solution comprises at least one fluorosurfactant, at least one acrylate- and/or methacrylate-functionalised silicone surfactant, at least one multi-functional acrylate, and one or more initiators.

11. A process according to claim 10, wherein the fluorosurfactant has a 0.1% solution surface tension (mN/m) in toluene of less than 24 mN/m.

* * * * *